United States Patent [19]

Pascucci

[11] Patent Number: 5,327,379
[45] Date of Patent: Jul. 5, 1994

[54] CURRENT OFFSET SENSE AMPLIFIER OF A MODULATED CURRENT OR CURRENT UNBALANCE TYPE FOR PROGRAMMABLE MEMORIES

[75] Inventor: Luigi Pascucci, Sesto S. Giovanni, Italy

[73] Assignee: SGS-Thomson Microelectronics S.r.l., Milan, Italy

[21] Appl. No.: 878,823

[22] Filed: May 4, 1992

[30] Foreign Application Priority Data

May 10, 1991 [IT] Italy .................. VA/91/A/0012

[51] Int. Cl.$^5$ ................................ G11C 7/00
[52] U.S. Cl. .................... 365/190; 365/203; 365/205; 365/210
[58] Field of Search ............ 365/190, 203, 205, 210

[56] References Cited

U.S. PATENT DOCUMENTS 4,694,427 9/1987 Miyamoto et al. ............... 365/205
5,138,579 8/1992 Tatsumi et al. ................... 365/203

Primary Examiner—Eugene R. LaRoche
Assistant Examiner—Christopher R. Glembocki
Attorney, Agent, or Firm—Seed & Berry

[57] ABSTRACT

A modulated-current offset-type or currentunbalance, offset-type sense amplifier for reading programmable memory cells employs loads identical to each other and a differential input pair of transistors of the differential amplifier are "cross-coupled" with said identical loads to realize a latch structure for storing an extracted data. The circuit utilizes three timing signals for sequentially modifying the configuration of the circuit and defining the following phases: start of a new reading cycle, precharging of capacitances associated with bit lines, and equalization of output nodes and line potentials, discrimination phase, reading and storing of the extracted data. Different embodiments employing different reference systems are described.

26 Claims, 6 Drawing Sheets

CURRENT OFFSET SENSE AMPLIFIER OF A MODULATED CURRENT OR CURRENT UNBALANCE TYPE FOR PROGRAMMABLE MEMORIES

DESCRIPTION

1. Technical Field

The present invention relates to a circuit for reading the information stored in a cell of a programmable static memory, e.g., a ROM or EPROM type memory, according to a differential sensing system employing a sense amplifier and an output latch circuit for storing an extracted (read) data.

2. Background of the Invention

Along with a constantly increasing packing density of integrated semiconductor devices, the reduction of the size of the single cells of static memory arrays, the attendant decrease of the operating current levels and the consequent magnified influence of parasitic electric factors of the integrated structures impose the use of a reading circuitry having an enhanced precision and reliability while ensuring a high speed.

The use of differential sense amplifiers attempts to treat the effects due to "process spread", temperature and supply voltage variations as common mode contributions. Moreover modulated-current offset type as well as current unbalance type sense amplifier attempts to free the sensing behavior from the maximum value that the supply voltage may reach, besides simplifying the dimensioning of transistors which form the sense amplifier in respect to the alternative load unbalance system.

Usually the required control of the output common mode of the high gain differential sense amplifier is conveniently implemented by using an output latch wherein the extracted (read) data may be stored. A sense amplifier with these characteristics is relatively complex and remains sensitive to noise.

SUMMARY OF THE INVENTION

A main objective of the present invention is to provide an improved sense amplifier of the so-called modulated-current offset type or of the current offset type, having a simplified circuit layout and employing a reduced number of components while having an enhanced immunity to noise, a high speed and a high reliability.

It is a further objective of the invention to provide a sense amplifier for a programmable memory having cross-coupled loads which also constitute a latch circuit for storing the extracted data, thus performing both amplification and output data storage functions. Basically, in the sense amplifier's circuit of this invention, the same identical load elements of the two branches or lines of the input network of the differential sense amplifier also constitute the loads of a differential input transistor pair of the amplifier and are cross-coupled whereby they form together with the same differential input transistor pair a latch circuit for storing the output data.

The different features and advantages of the circuit object of the present invention will become clear from the following description of several preferred embodiments and reference to the attached drawings.

DETAILED DESCRIPTION OF THE INVENTION

Figure 1:
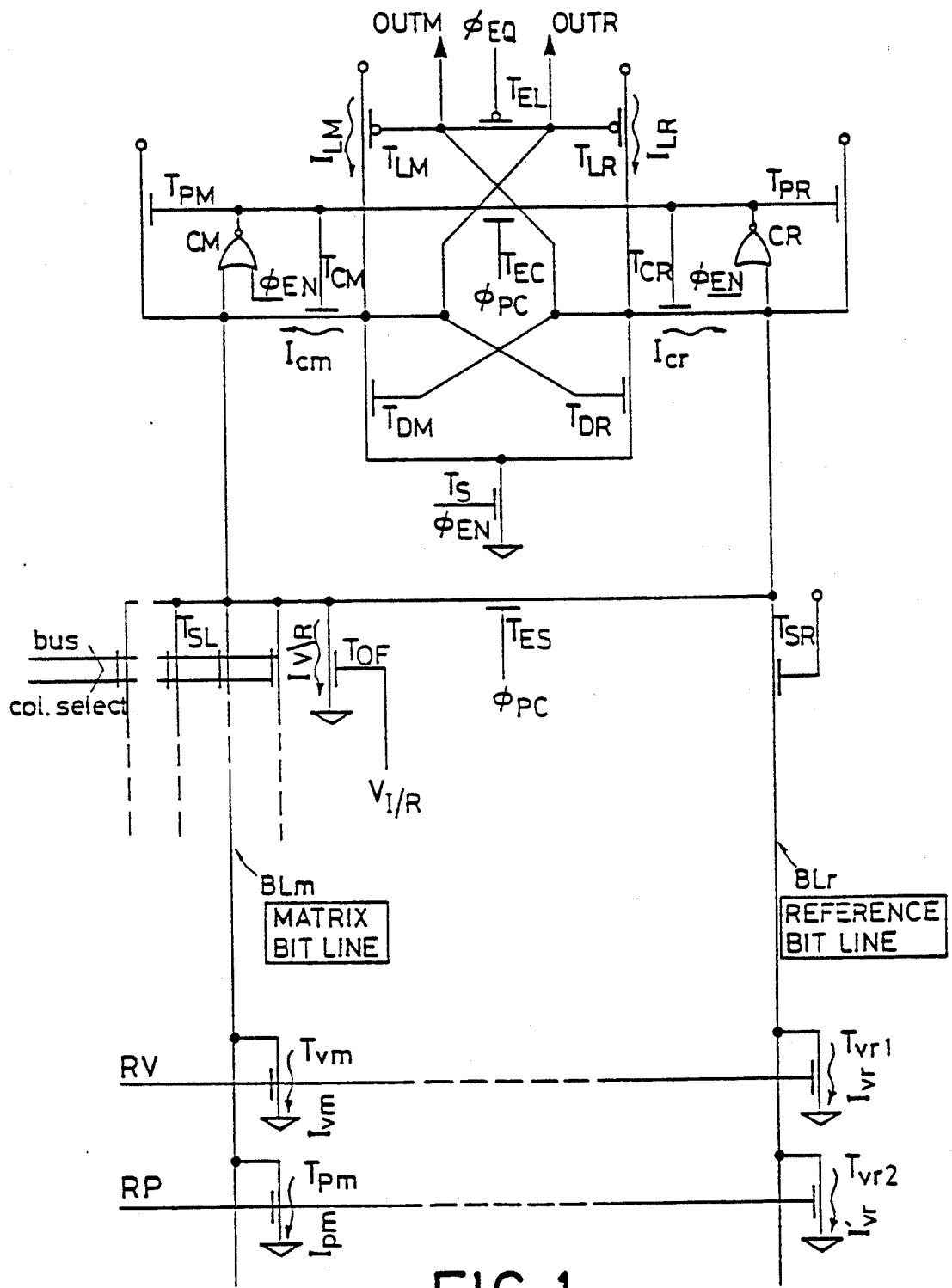
FIG. 1 is a circuit diagram of a sense amplifier of the modulated-current offset type, according to a first embodiment of the invention.

A first embodiment of the circuit of the invention, of a modulated-current offset type, is shown in FIG. 1. In the bottom half of the circuit diagram is shown in a schematic manner the organization of a memory matrix, organized in rows (word lines) and columns (bit lines) of cells. From the "matrix side", the different columns (MATRIX BIT LINE) may be individually selected through a multiplexer driven by the bus COL.-SELECT. A reference bit line, BLr (REFERENCE BIT LINE), contains virgin memory cells which act as reference elements for determining the state of the programmable cells of the bit lines of the memory matrix.

The top portion of the diagram shows a reading circuit made in accordance with the invention, which employs a single stage differential amplifier formed by a pair of input transistors $T_{DM}$ and $T_{DR}$ and by a current generator TS, which may be enabled or disabled. The respective load elements, which in the example shown are two p-channel transistors, $T_{LM}$ and $T_{LR}$, are cross-coupled in order to form, together with the same input transistors of the differential amplifier: $T_{DM}$ and $T_{DR}$, also a latch circuit for storing the output data which is represented by the signal present on the output nodes OUTM and OUTR of the reading circuit.

Significantly, the same loads $T_{LM}$ and $T_{LR}$ of the output latch also constitute the loads of the reference branch and of the branch containing the selected matrix cell to be read, of an input network of the differential sense amplifier, respectively. In the example shown, these branches are represented by the reference line BLr and by the selected matrix side bit line BLm. The two lines of the input network of the differential sense amplifier are precharged, in preparation of an actual reading step, through the switches $T_{PM}$ and $T_{PR}$, respectively, which momentarily connect the respective line to the supply for a preestablished time interval in order to charge the capacitances associated with the two input lines of the differential sense amplifier.

Two NOR gates, CM and CR, respectively, which may be formed by a cascode circuit, may be utilized for setting the point of operation of the sense amplifier by controlling a fast precharge of the two lines of the input network through the respective switches $T_{PM}$ and $T_{PR}$ and simultaneously the capacitive decoupling of the input lines from the output nodes of the sense amplifier: OUTM and OUTR, by means of the pass transistors $T_{CM}$ and $T_{CR}$. To an input node of each of said NOR gates, a first timing signal $\Phi_{EN}$ is applied, which is also applied to a control terminal of the current generator TS which enables the sense amplifier. A first switch $T_{EC}$ permits to equalize the output node of the two cascode circuits CM and CR during the precharge step of the input lines and a second switch $T_{ES}$ permits to equalize the input lines during the precharge step. A second timing signal $\Phi_{PC}$ is applied to the control terminals of both equalization switches $T_{EC}$ and $T_{ES}$. Eventually this second timing signal $\Phi_{PC}$ determines the start of a reading phase at the end of the precharging phase of the lines, by interrupting the respective equalization paths, that is by opening the switches $T_{EC}$ and $T_{ES}$. The switch $T_{EL}$, connected between the two output nodes of the reading circuit, maintains in a state of substantial equalization the load elements $T_{LM}$ and $T_{LR}$ of the reading circuit until the conclusive valutation phase of a reading cycle is reached, that is when the switch $T_{EL}$ is opened by the respective timing signal $\Phi_{EQ}$, in order to permit a full evolution of a difference of potential between the output nodes OUTM and OUTR.

The operation of the circuit of FIG. 1 is as follows.

Figure 2:
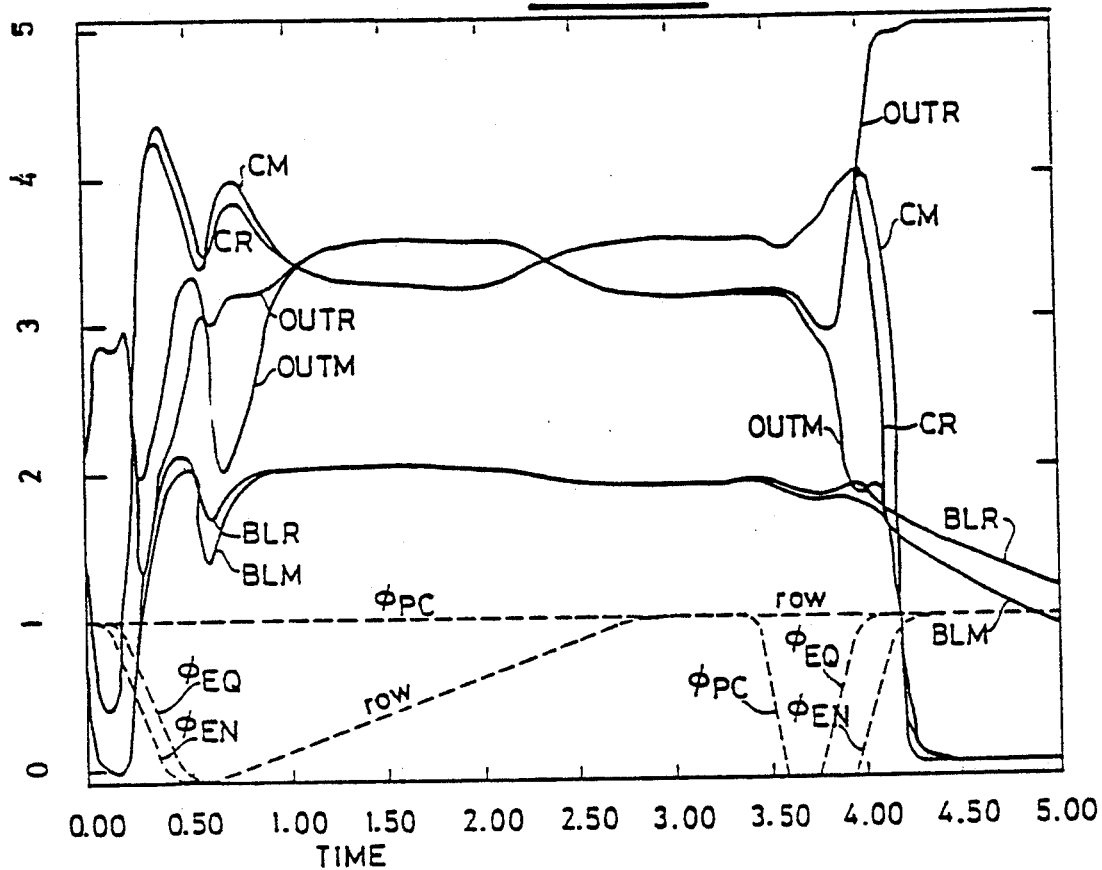
FIG. 2 is a timing diagram of the circuit of FIG. 1 during a reading cycle.

The form of the various signals of the circuit during a complete reading cycle, as described above, is shown in the diagram of FIG. 2.

The rest condition of the reading circuit, which is characterized by nil power consumption, is determined by the three timing signals: $\Phi_{EN}$, $\Phi_{PC}$ and $\Phi_{EQ}$, all at a high logic level ("1") and represents the natural condition from which any new reading cycle begins and to which the system returns after having extracted the data. In this rest condition, the output nodes of the two NOR gates, CM and CR, are forced to ground potential by $\Phi_{EN}$ being high. The output nodes OUTM and OUTR are at logically opposed levels: "1" and "0" or vice-versa, in conformity with the last extracted data stored by the circuit. No power consumption is possible because of the action of $\Phi_{EN}$, on the cascodes CM and CR and moreover the other timing signal $\Phi_{EQ}$, maintained at a logic high level, interrupts any possible path between the supply node and ground (VCC-GND).

A new reading cycle begins with the switching from "1" to "0" of the control signals $\Phi_{EN}$ and $\Phi_{EQ}$, which free the cascodes CM and CR, thus permitting them to drive a fast pre-charge of the capacitances of the reference line BLr and of the selected matrix's bit line BLm until the design working point of the sense amplifier is attained. At the same time, various nodes in the system equalize at various levels: for example at the level shown in FIG. 2 for OUTM and OUTR nodes; at the level shown for the output nodes of the two cascodes circuits, CM and CR; and at the level shown for the bit lines BLr and BLm. The circuit elements are sized and designed such that at the end of the fast pre-charge period, the OUTM and OUTR nodes, duly equalized, take a potential which is apt to provide, through the loads $T_{LM}$ and $T_{LR}$, the sum of the currents drawn by the selected cells of the matrix line and of the reference line.

As soon as propagation of any control signal within the circuit may be assumed as completed, this first step of the reading cycle is terminated by the switching from "1" to "0" of the control signal $\Phi_{PC}$ so as to initiate a preevaluation or discrimination phase of the state of the selected cells which will produce only relatively small potential variations at the OUTM and OUTR nodes and at the output nodes of the NOR gates (cascodes) CM and CR, but in an extremely small period of time, by virtue of the design freedom offered by the circuit of the invention to size the components of the input network so as to effectively minimize any undue shift of potential of the bit lines BLm and Blr during this critical discrimination phase.

The evaluation step is completed by the switching from "0" and "1" of the control signal $\Phi_{EQ}$ which occurs soon after said switching of the control signal $\Phi_{PC}$. When this event takes place, the small difference of potential present at the OUTM and OUTR nodes rapidly evolves firstly toward the asymptotes VCC-(VBL-VBR) and subsequently toward the asymptotes VCC-GND upon the switching back from "0" to "1" of the control signal $\Phi_{EN}$, which takes place immediately after the switching of the control signal $\Phi_{EQ}$. This sequence of events, beside digitalizing and storing the extracted data, resets automatically the system to the rest condition characterized by a nil power consumption.

Of course, the events described above take place in a short period of time, the entire cycle occurring in less than a second, thus achieving an extremely short reading time.

The current drawn by the system, after the precharge phase is terminated, is totally provided through the loads $T_{LM}$ and $T_{LR}$ in order to concentrate through the load elements the entire current signal of the system. The peculiar cross-coupled connection of the loads $T_{LM}$ and $T_{LR}$ confers to the sense amplifier a positive feedback which enhances the amplifying capacities without the need of further amplifying stages.

The load elements $T_{LM}$ and $T_{LR}$ and the differential input transistor pair: $T_{DM}$ and $T_{DR}$, in the last phase of the reading cycle are so configured as to form a latch circuit, capable of storing the extracted data beside effectively suppressing any common mode disturbance, thus making the sense amplifier exceptionally immune to noise and to other possible causes of instability.

The reference system of the sense amplifier of FIG. 1 for discriminating the state of a selected matrix's cell (virgin or programmed) utilizes a MOS transistor $T_{OF}$, which is functionally associated to the selected matrix's line. The transistor $T_{OF}$ is a current modulating transistor functionally connected to the bit line to be read. The transistor $T_{OF}$ is sized and designed to be capable of generating under any condition of supply voltage a current equal to half the current drawn by a virgin cell, and can be designed in accordance with an offsetting technique commonly referred to as "modulated-current" offsetting, which is well known to a skilled technician.

Within the circuit:

Ivm is the current drawn by a matrix's virgin cell;

Ivr is the current drawn by a reference virgin cell;

Ipm is the current drawn by a matrix's programmed cell;

Iv is the current drawn by a generic virgin cell; and

Iof is the offset current; and the circuits are designed such that:

Ivm = Ivr = Iv

Iof = Iv/2 (offset current)

Ipm = 0

The following system of current inequalities affords discrimination:

Ivm+Iof>Ivr for a selected virgin cell;
Ipm+Iof<Ivr for a selected programmed cell;
Iv+Iv/2>Iv for a selected virgin cell; and
0+Iv/2<Iv for a selected programmed cell.

Figure 3:
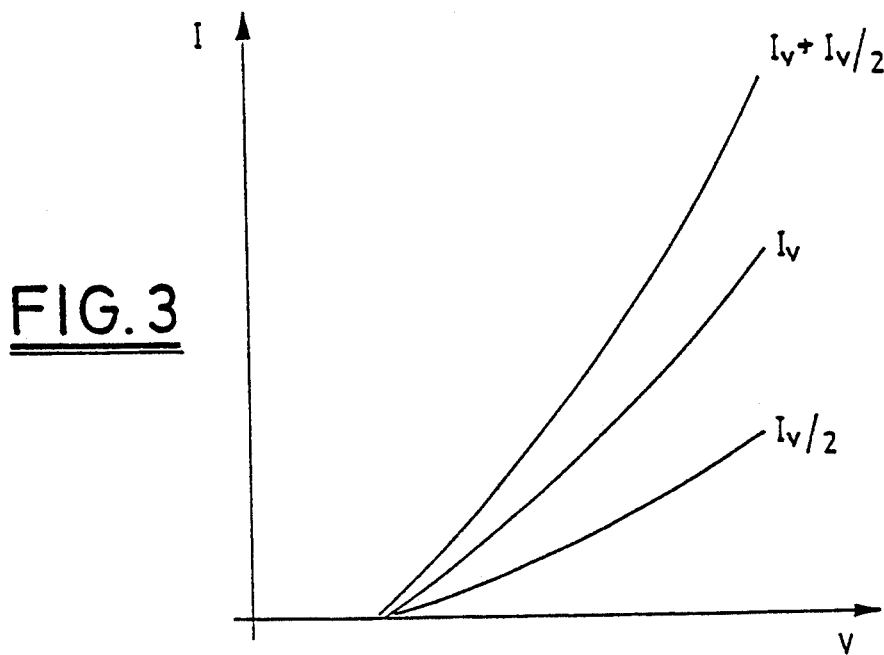
FIG. 3 is a diagram of the operation characteristics of the sense amplifier of FIG. 1.

The curves which characterize the above inequalities are shown in the diagram of FIG. 3.

Among the main advantages of the sense amplifier of the invention the following may be cited:
i) use of a reduced number of components and of amplifying stages by performing also the function of storing the extracted data within the structure of the differential sense amplifier;
ii) the only power dissipating structures are the cascode circuits which form the two NOR gates which are disabled during the evaluation step;
iii) the load elements are an integral part both of the sense amplifier as well as of the output latch associated therewith; this enhances immunity to noise during and after a reading cycle;
iv) an immediate decoupling of the large capacitances of bit lines and of the multiplexer (i.e., the structure which performs the selection of the path to a selected matrix's cell to be read) during the critical discrimination step is ensured by the circuit, thus enhancing speed and reliability;
v) good sensitivity and speed by virtue of the cross-coupled connection of the loads;
vi) the circuit has lesser design restraints than known circuits and remains operative also in presence of large variations of current levels by preventing undesired saturation conditions;
vii) the circuit is intrinsically suitable to operate in memory devices which require rather high bias levels of the lines.

Figure 4:
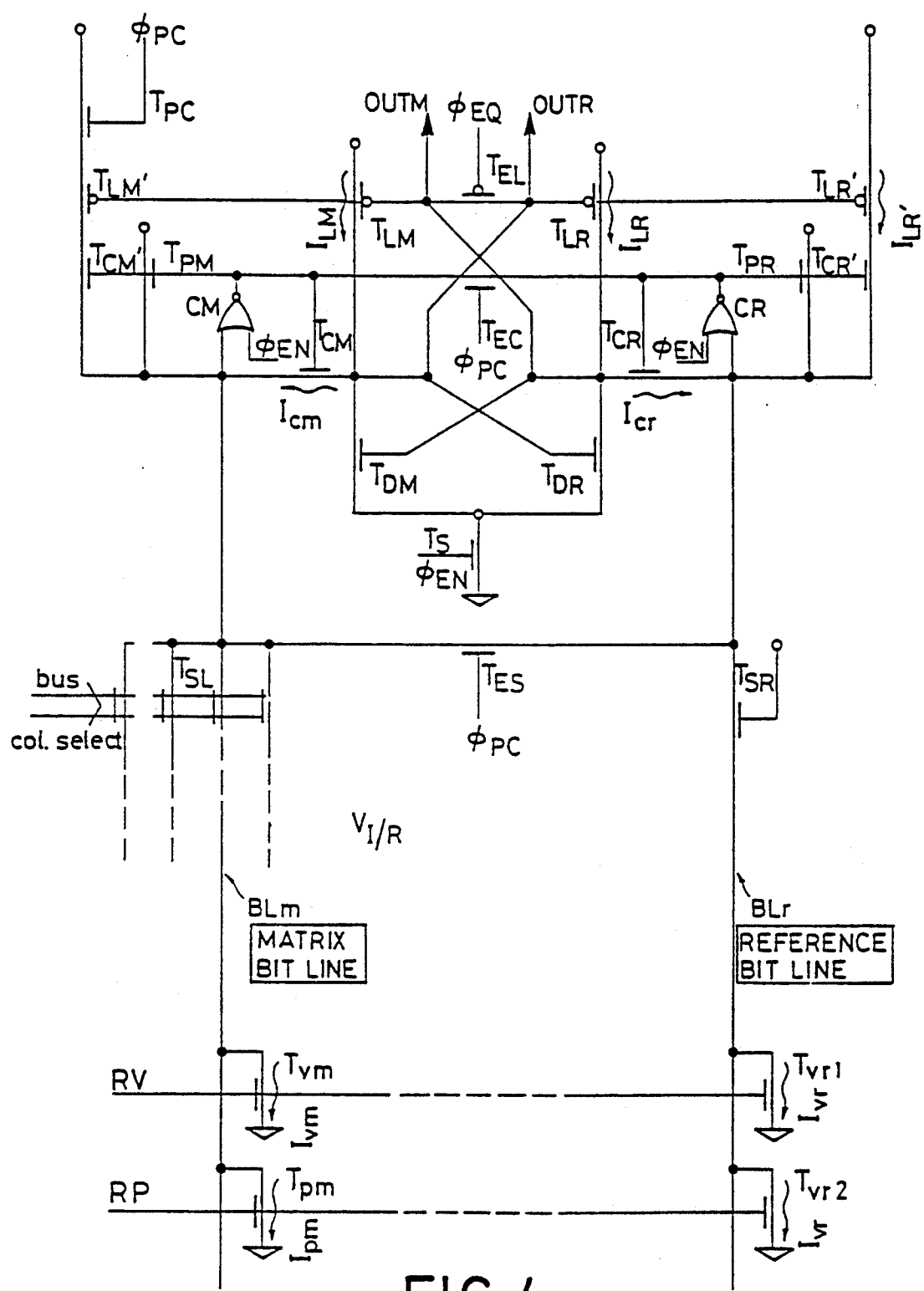
FIG. 4 is a circuit diagram of a sense amplifier the current unbalance type, according to an alternative embodiment of the present invention.

An alternative embodiment of the circuit of the invention is depicted in FIG. 4. According to this alternative embodiment there is not a current modulating transistor functionally connected to the bit line to be read as in the previously described example, by contrast the current unbalance condition is implemented in a different manner as will be described later.

Structurally the reading circuit is substantially similar to the circuit shown in FIG. 1, as confirmed by utilizing the same symbols for identifying the various functionally similar components of the two circuits.

Differently from the circuit of FIG. 1, a second connection path to the supply rail is arranged both for the reference bit line BLr and the selected matrix's bit line Blm during the fast precharging step of a reading cycle. This additional path is controlled by the switch $T_{CR}'$ in the case of the reference bit line BLr and by the switch $T_{CR}'$ and by a second switch $T_{PC}$ functionally in series with the switch $T_{CM}'$ and driven by the timing signal $\Phi_{PC}$, for the case of the selected matrix's bit line BLm. Moreover a p-channel transistor, $T_{LM}'$ and $T_{LR}'$, respectively, is connected as a load element in each of said two additional connection paths to the supply rail of the reference line and of the selected line, respectively.

Differently from known current offset circuits which normally utilize a load transistor ($T_{CR}$) of double the size of the other (dual) load transistor ($T_{LM}$) and which therefore exclude symmetry of the two branches of the input network of the sense amplifier, the addition of these two additional connection paths to the supply permits maintaining a virtually perfect symmetry of the size of transistors which makes possible the operation of the circuit also as an output latch.

Figure 5:
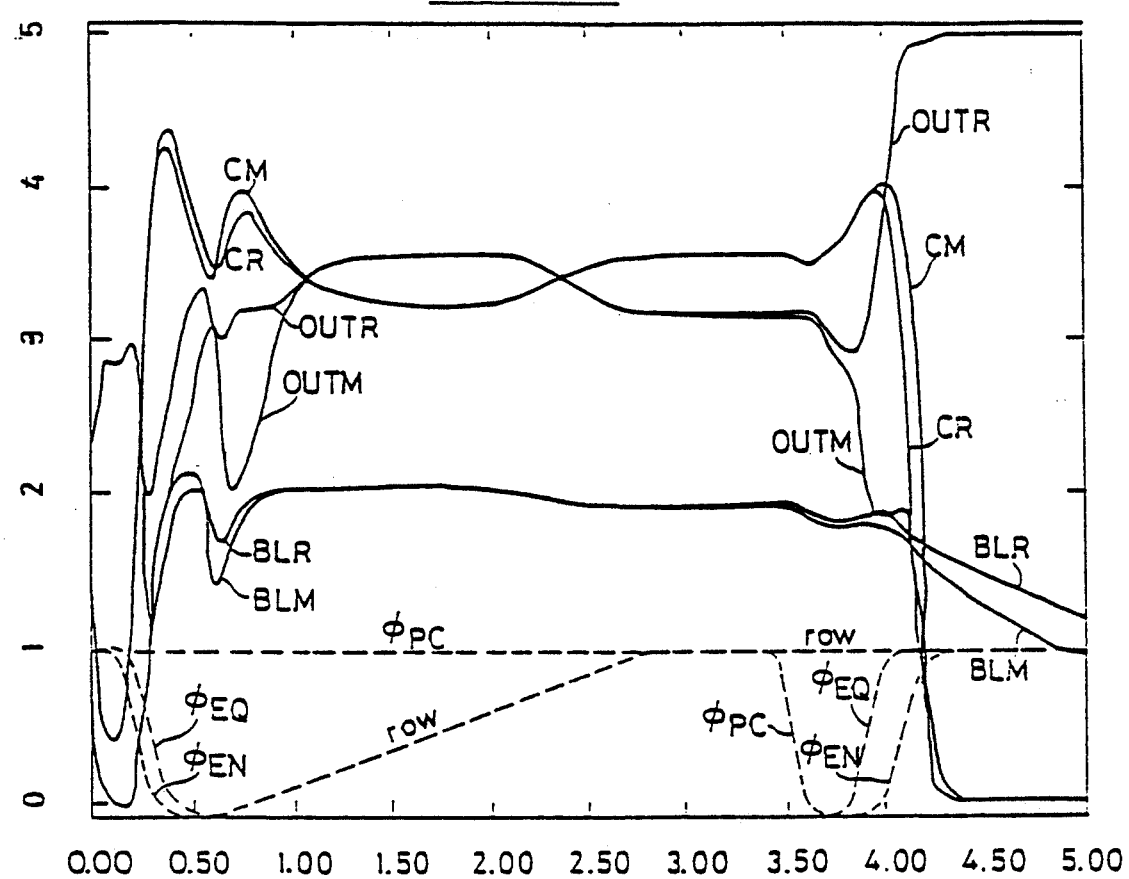
FIG. 5 is a diagram of the circuit of FIG. 4 during a reading cycle.

The operation of the reading circuit of FIG. 4 is as follows:

The form of the various signals of the circuit of FIG. 4 during a complete reading cycle, as now described, is shown in the diagram of FIG. 5.

The rest condition of the reading circuit, which is characterized by nil power consumption, is determined by the three timing signals: $\Phi_{EN}$, $\Phi_{PC}$ and $\Phi_{EQ}$, all at a high logic level ("1") and represents the natural condition from which any new reading cycle begins and to which the system returns after having extracted the data. In this rest condition, the output nodes of the two NOR gates, CM and CR, are forced to ground potential by $\Phi_{EN}$. The output nodes OUTM and OUTR are at logically opposed levels: "1" and "0" or vice-versa, in conformity with the last extracted data stored by the circuit. No power consumption is possible because of the action of $\Phi_{EN}$, on the cascodes CM and CR and moreover the other timing signal $\Phi_{EQ}$, maintained at a logic high level, interrupts any possible path between the supply node and ground (VCC-GND).

A new reading cycle begins with the switching from "1" to "0" of the control signals $\Phi_{EN}$ and $\Phi_{EQ}$ which free the cascodes CM and CR, thus permitting them to drive a fast precharge of the capacitances of the reference line BLr and of the selected matrix's bit line BLm until the design working point of the sense amplifier is attained. At the same time various nodes in the system equalize at various levels, for example at the load's level shown FIG. 5 for OUTM and OUTR nodes; at the level shown for the output nodes of the two cascodes circuits, CM and CR; and at the level shown for the bit lines BLr and BLm. At the end of the fast pre-charge period, the OUTM and OUTR nodes, duly equalized; take a potential which is apt to provide, through the loads $T_{LM}$, $T_{LR}$ and $T_{LM}'$, $T_{LR}'$, the sum of the currents drawn by the selected cells of the matrix line and of the reference line. As soon as propagation of any control signal within the circuit may be assumed as completed, this first step of the reading cycle is terminated by the switching from "1" to "0" of the control signal $\Phi_{PC}$ which interrupts the additional connection path of the selected matrix's bit line to the supply and the equalization paths between the output nodes of the two cascodes CM and CR and the two lines Blm and Blr so as to initiate a preevaluation phase of the state of the selected cells which will produce only relatively small potential variations at the OUTM and OUTR nodes and at the output nodes of the NOR gates (cascodes) CM and CR, but in an extremely small period of time, by virtue of the design freedom offered by the circuit of the invention to size the components of the input network so as to effectively minimize any undue shift of potential of the bit lines: BLm and Blr during this discrimination phase.

The evaluation step is completed by the switching from "0" to "1" of the control signal $\Phi_{EQ}$ which occurs soon after said switching of the control signal $\Phi_{PC}$. When this event takes place, the small difference of potential present at the OUTM and OUTR nodes rapidly evolves firstly toward the asymptotes VCC-(VBL-VBR) and subsequently toward the asymptotes VCC-GND upon the switching back from "0" to "1" of the control signal $\Phi_{EN}$, which takes place immediately after the switching of the control signal $\Phi_{EQ}$. This sequence of events, besides digitalizing and storing the extracted data, resets automatically the system to the rest condition characterized by a nil power consumption.

Of course, the events described above take place in a short period of time thus achieving an extremely short reading time.

The current drawn by the system, after the initial pre-charge phase and the discrimination phase is terminated, is provided through the loads $T_{LM}$ and $T_{LR}$ in order to concentrate through the load elements of the sense amplifier the entire current signal of the system.

The peculiar cross-coupled connection of the loads $T_{LM}$ and $T_{LR}$ confers to the sense amplifier a positive feedback which enhances the amplifying capacities without the need of further amplifying stages.

The load elements $T_{LM}$ and $T_{LR}$ and the differential input transistor pair: $T_{DM}$ and $T_{DR}$, in the last phase of the reading cycle are so configured as to form a latch circuit, capable of storing the extracted data beside effectively suppressing any common mode disturbance, thus making the sense amplifier exceptionally immune to noise and to other possible causes of instability.

The reference system of the sense circuit of FIG. 4 is different from that of the circuit of FIG. 1. In order to permit to the sense amplifier to discriminate the state of a selected matrix's cell (virgin or programmed), a current unbalance at the loads level, which on the other hand must remain virtually identical in order to permit a correct operation of the circuit also as an output latch, is implemented by opening the switch $T_{PC}$ thus interrupting, at the end of the fast precharging phase, the additional current contribution of the secondary or additional precharge path through the matrix's bit line selected for reading, which is controlled by the switch $T_{CM}'$ and which is provided with a load $T_{LM}'$.

Within the circuit of FIG. 4:

Ivm is the current drawn by a matrix's virgin cell
Ivr is the current drawn by a reference virgin cell
Ipm is the current drawn by a programmed matrix's cell
Iv is the current drawn by a generic virgin cell
Ilm is the current drawn by the load on the matrix side $T_{LM}$
Ilr is the current drawn by the load on the reference side $T_{LR}$
Ilr' is the current drawn by the unbalancing load $T_{LR}'$ on the reference side
Icm is the current through the pass-transistor $T_{CM}$
Icr is the current through the pass-transistor $T_{CR}$
Icr' is the current through the pass-transistor $T_{CR}'$
and:
Ivm=Ivr=Iv
Ipm=0
Ivm=Icmv
Ivp=Icmp
Ivr=Icr+Icr'
Icr=Icr'
Icr=Ivr/2

The following system of inequalities affords discrimination:

Icmv>Icr for a selected virgin cell;
Icmp<Icr for a selected programmed cell;
Ivm>Ivr/2 for a selected virgin cell;
Ipm<Ivr/2 for a selected programmed cell;
Iv>Iv/2 for a selected virgin cell; and
0<Iv/2 for a selected programmed cell.

Figure 6:
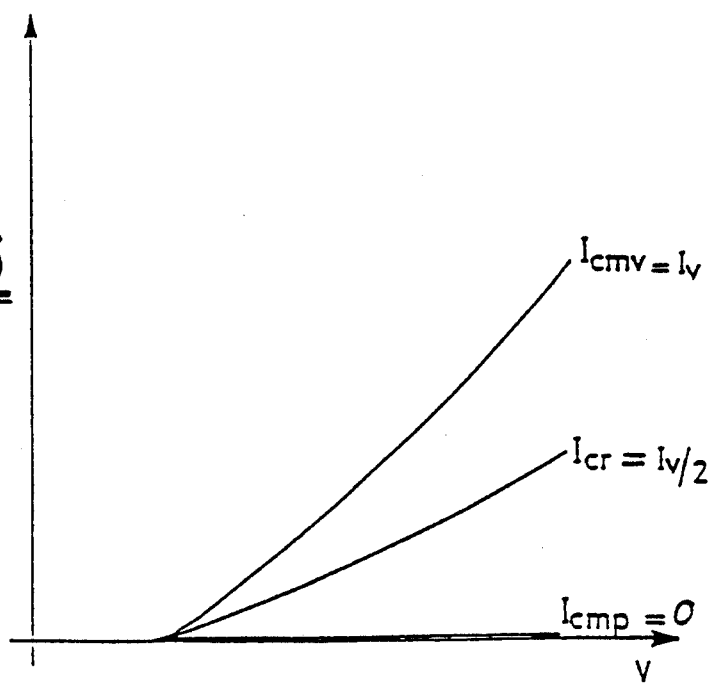
FIG. 6 is a diagram of the operation characteristics of the sense amplifier of FIG. 4.

The curves which characterize the above inequalities are shown in the diagram of FIG. 6.

Also in the case of the alternative embodiment of FIG. 4, the sense circuit of the invention offers the same advantages of the circuit of FIG. 1.

Figure 7:
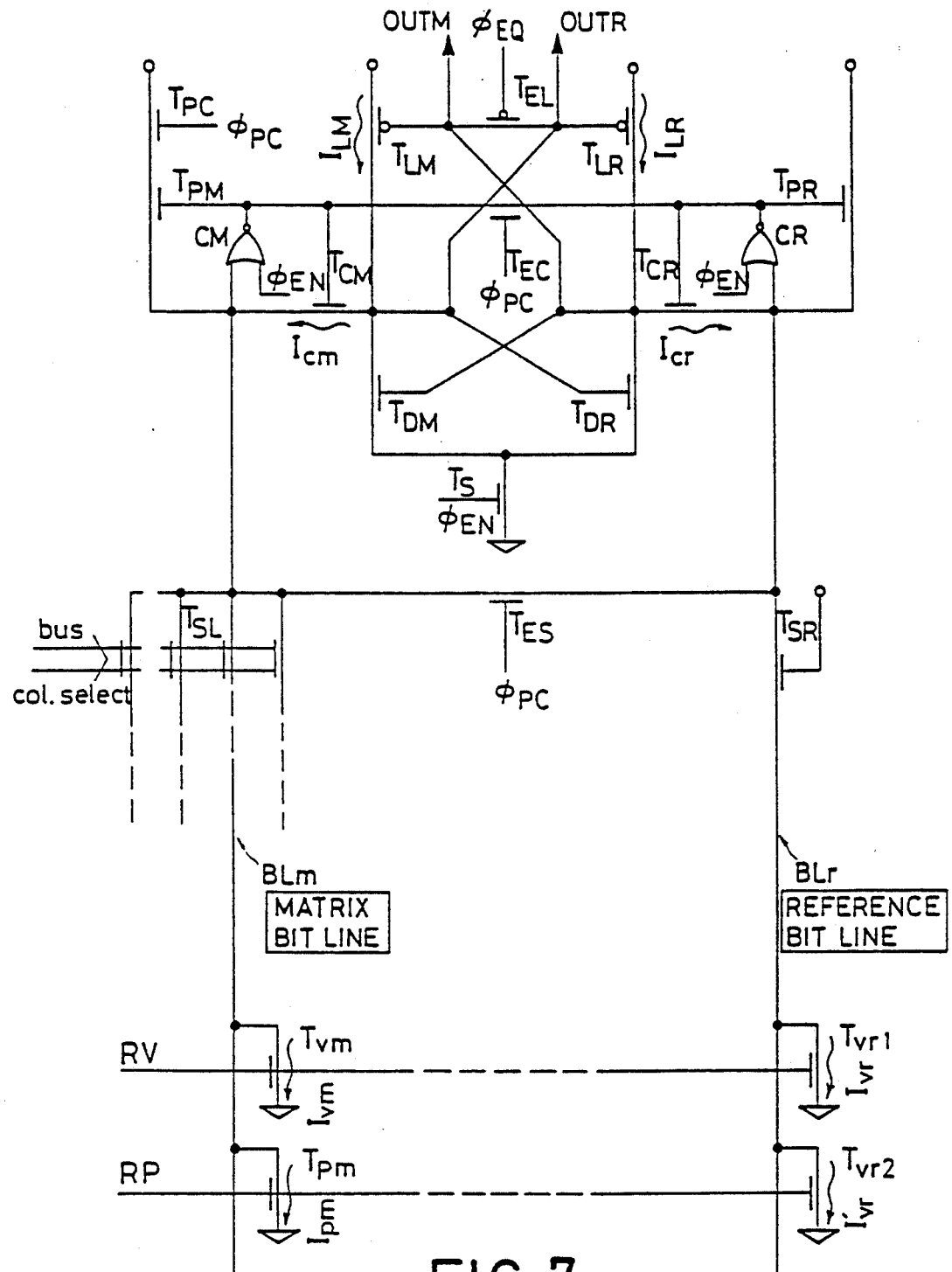
FIG. 7 is a circuit diagram of another embodiment of a current offset type sense amplifier according to the invention.

A current offset type embodiment of the sense circuit of the invention, may also be realized in a simpler form than that of FIG. 7.

In this further embodiment, the current offsetting elements in the two branches of the input network of the sense amplifier are constituted by the transistors $T_{PC}$ and $T_{PM}$ on the matrix side and by the transistor $T_{PR}$ on the reference side.

The operation of the reading circuit of FIG. 7 is substantially similar to that of the circuit of FIG. 4, as will be evident to any skilled technician. Therefore a further reiteration of a detailed description of the operation of the circuit would appear largely superfluous.

Also in this alternative embodiment the ability of discriminating the state of a selected cell (virgin or programmed), is achieved by means of a current offset through the load elements $T_{LM}$ and $T_{LR}$, which, on the other hand, must continued to be rigorously identical both dimensionally as well as geometrically, in order to permit a correct functioning of the latch structure. Such a current offsetting is realized by placing in an OFF condition the $T_{PC}$ MOS transistor thus interrupting in this way, at the end of the precharge phase, the additional current contribution provided by the additional connection path to the supply through the $T_{PC}$ and $T_{PM}$ transistors of the line of the input network relative to the matrix's cell selected for ready.

The reference system of the sense amplifier circuit of FIG. 7 is the following.

Given:

Ivm current drawn by a matrix's virgin cell
Ivr current drawn by a reference virgin cell
Ipm current drawn by a programmed matrix's cell
Iv current drawn by a generic virgin cell
Ilm current drawn by the load on the matrix side $T_{LM}$
Ilr current drawn by the load on the reference side $T_{LR}$
Icm current through the pass-transistor $T_{CM}$
Icr current through the pass-transistor $T_{CR}$
Ipr current through the pass-transistor $T_{PR}$ and:

Ivm=Ivr=Iv

Ipm=0

Icm=Ivm=Iv current through the pass-transistor TCM with a virgin cell selected

Icm=Ipm=0 current through the pass-transistor TCM with a programmed cell selected

Ipr=Icr which implies TCR=TPR
from where:
Ivr=Icr+Ipr
Ivr=2Icr=Icmv
Ivr=2Ipr=Icmv The following system of disequations affords discrimination:

| | |
|---|---|
| $I_{cmv} > I_{cr}$ | selected virgin cell |
| $I_{cmp} < I_{cr}$ | selected programmed cell |
| $I_{vm} > I_{vr}/2$ | selected virgin cell |
| $I_{pm} < I_{vr}/2$ | selected programmed cell |
| $I_v > I_v/2$ | selected virgin cell |
| $0 < I_v/2$ | selected programmed cell |

Figure 8:
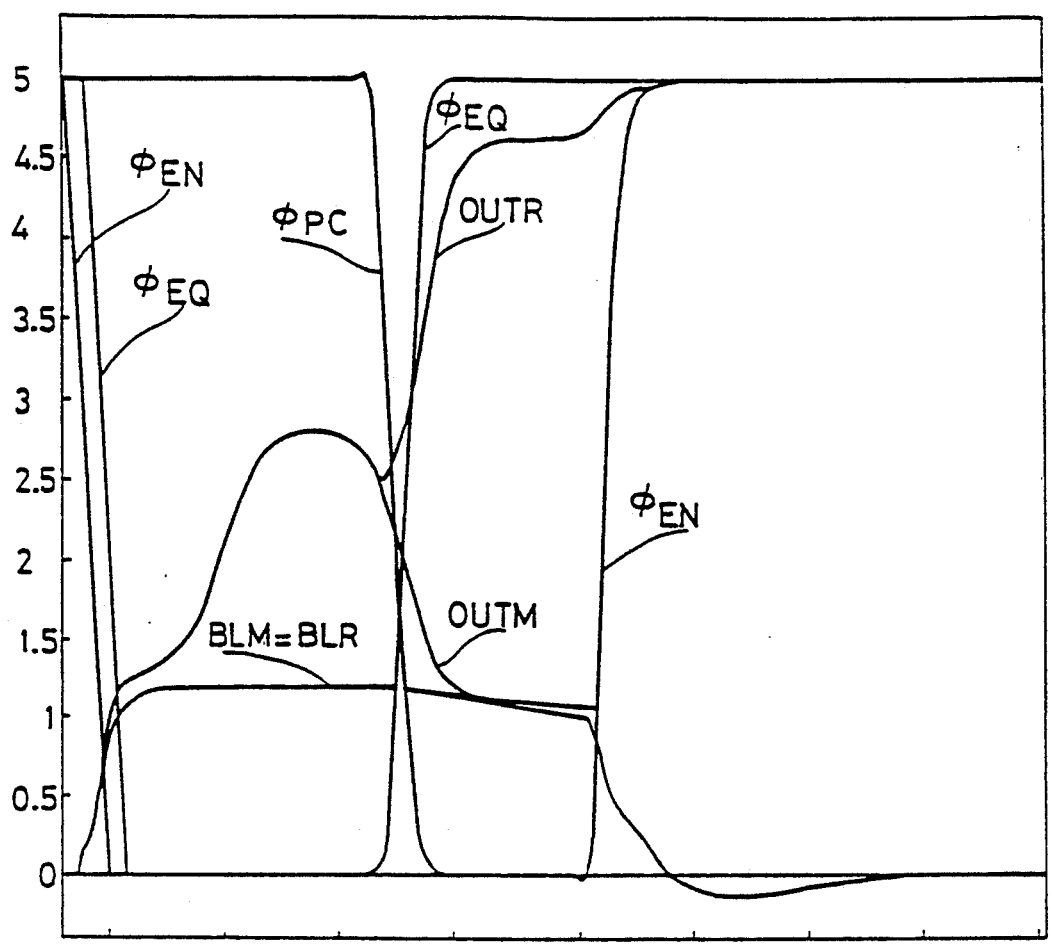
FIG. 8 is a timing diagram of the circuit of FIG. 7 during a reading cycle.
Figure 9:
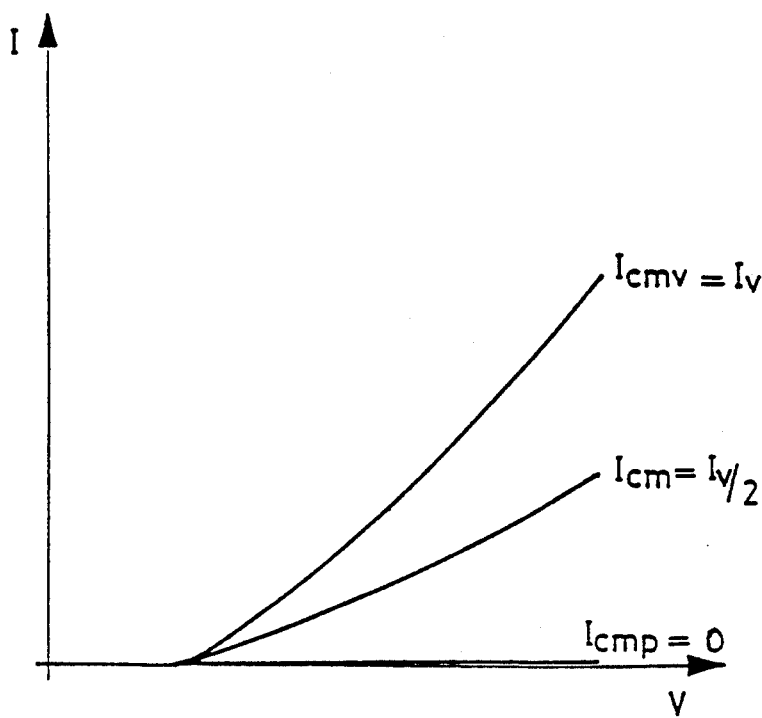
FIG. 9 is a diagram of the operation characteristics of the current offset type sense amplifier of FIG. 7.

The form of the relevant signals, during a complete reading cycle, is shown in the diagram of FIG. 8 and the characteristics of the discriminating system are shown in the diagram of FIG. 9.

Also the sense amplifier's circuit of FIG. 7 offers substantially the same advantages of the circuits of the preceding embodiments.

I claim:

1. A current offset type differential sense amplifier comprising:
   a first input node and a second input node connected to a first line containing at least a reference cell and a second line containing a selected memory cell, respectively, each line having an electrical path operatively connecting each of said lines through an essentially identical load to a supply rail; and
   said identical loads of the two lines being cross-coupled to said input nodes and constitute also the loads of a differential input pair of transistors of said differential sense amplifier during a discrimination phase of a reading cycle and form together with said input transistor pair a latch for storing extracted data during a last phase of a reading cycle, said latch having a pair of output nodes; and
   a second electrical path functionally connecting each of said lines to said supply rail, each of said paths being controlled by at least a pair of switches, said pair including a connecting switch between the supply rail and the respective line and a decoupling switch between the respective input node and the line; each pair of switches being driven by a control gate circuit, said circuit having a pair of input terminals and an output terminal, said output terminal connected to control terminals of said switches, the first input terminal connected to the respective line and the second input terminal connected to a first enabling timing signal.

2. A sense amplifier as defined in claim 1 wherein said identical loads are transistors having a control terminal which is connected to one and to the other of said output nodes, respectively, and cross coupled to said input nodes, respectively; a reset switch being connected across said output nodes and having a control terminal to which a second timing signal is applied.

3. A sense amplifier according to claim 2, further comprising:
   an enable terminal of a current generator of said differential sense amplifier to which the first enabling timing signal is fed; a first equalizing switch, functionally connected between said two lines and a second equalizing switch functionally connected between the output terminals of said control gate circuits, driven by a third timing signal; and
   an evaluation phase of a reading cycle being initiated upon the opening of said two equalizing switches.

4. A sense amplifier according to claim 3 wherein said control gate circuit is a NOR gate.

5. A sense amplifier according to claim 4 wherein said NOR gate is a cascode circuit.

6. A sense amplifier according to claim 3 wherein a current generator capable of generating a current equal to half the current which is drawn by a virgin memory cell forces an offsetting current through the line containing the selected memory cell to be read.

7. A sense amplifier according to claim 6 wherein said identical loads of said second electrical paths are also identical to the cross-coupled loads of said differential sense amplifier and output storage latch.

8. A sense amplifier according to claim 3 wherein:
   said first equalizing switch, driven by said third timing signal for determining a current offset condition between the two lines at the end of a precharge phase of a reading cycle.

9. A sense amplifier according to claim 2 wherein said loads and said reset switch are p-channel transistors.

10. A method for reading the information stored in a cell of a programmable memory matrix comprising:
    using a pair of NOR gates to drive a pair of pass transistors, the first pass transistor connecting a selected matrix bit line to a matrix bit line sense node of a differential amplifying stage, the second pass transistor connecting a reference line to a reference line sense node of the differential amplifying stage;
    comparing the conductivity of the selected matrix bit line containing said cell and the conductivity of the reference line containing a reference cell of a known state which comprises forcing a current of a predetermined level through each of said lines and through a load functionally connected to each line for converting a differential current signal into a voltage difference;
    amplifying said voltage difference by means of the differential amplifying stage, for producing a logic voltage difference between two output nodes representative of the state of said cell; and
    storing the extracted information in an output latch by utilizing two equal loads connected to said lines and cross-coupled thereto to form together with a differential input pair of transistors of a differential amplifying stage an output storage latch for storing the extracted information.

11. The method according to claim 10, further including:
    drawing current equal to half the current drawn by a virgin cell through a transistor functionally connected to the bit line while comparing the conductivity of a selected matrix's bit line containing said cell and the conductivity of a reference line containing the reference cell.

12. The method according to claim 10, further including:
    switching a first clock signal low to precharge a pair of sense nodes to a selected voltage, wherein the first sense node functionally connects the matrix bit line to the amplifying stage and the second sense node functionally connects the reference line to the amplifying stage;
    maintaining said first clock signal low until said sense nodes reach a stable voltage;
    switching a second clock signal low to initiate a discrimination phase to produce a relatively small potential difference between a reference node and a storage node;

switching a third clock signal high to initiate an evaluation phase that rapidly amplifies the small difference of the discrimination phase into a large difference; and switching said first clock signal to high to drive the output signal completely to either Vcc or ground, depending on the state of the read data, and placing the sense amplifier in a zero power consumption state.

13. The method according to claim 12, further including:

switching said third clock signal low prior to switching said second clock signal low to connect the two equal loads of the output latch to each other and the switching of the third clock signal high disconnects the equal loads from each other to initiate the evaluation phase.

14. The method according to claim 13 wherein switching said first clock signal low simultaneously disconnects the sources of the differential output pair to ground and enables the no voltages on a bit line and a reference bit line to control the output of respective NOR gates to enable the read data to be applied to the appropriate sense nodes.

15. A method for reading the information stored in a cell of a programmable memory matrix comprising:

comparing the conductivity of a selected matrix bit line containing said cell and the conductivity of a reference line containing a reference cell of a known state which comprises forcing a current of a predetermined level through each of said lines and through a load functionally connected to each line for converting a differential current signal into a voltage difference;

amplifying said voltage difference by means of a differential amplifying state, for producing a logic voltage difference between two output nodes representative of the state of said cell;

storing the extracted information in an output latch by utilizing two equal loads connected to said lines and cross-coupled thereto to form together with a differential input pair of transistors of a differential amplifying stage an output storage latch for storing the extracted information;

switching a first clock signal low to precharge a pair of sense nodes to a selected voltage, wherein the first sense node functionally connects the matrix bit line to the amplifying stage and the second sense node functionally connects the reference line to the amplifying stage;

maintaining said first clock signal low until said sense nodes reach a stable voltage;

switching a second clock signal low to initiate a discrimination phase to produce a relatively small potential difference between a reference node and a storage node;

switching a third clock signal high to initiate an evaluation phase that rapidly amplifies the small difference of the discrimination phase into a large difference; and switching said first clock signal to high to drive the output signal completely to either Vcc or ground, depending on the state of the read data, and placing the sense amplifier in a zero power consumption state.

16. The method according to claim 15, further including:

switching said third clock signal low prior to switching said second clock signal low to connect the two equal loads of the output latch to each other and the switching of the third clock signal high disconnects the equal loads from each other to initiate the evaluation phase.

17. The method according to claim 16 wherein switching said first clock signal low simultaneously disconnects the sources of the differential output pair to ground and enables the no voltages on a bit line and a reference bit line to control the output of respective NOR gates to enable the read data to be applied to the appropriate sense nodes.

18. The method according to claim 15, further including:

drawing current equal to half the current drawn by a virgin cell through a transistor functionally connected to the bit line while comparing the conductivity of a selected matrix's bit line containing said cell and the conductivity of a reference line containing the reference cell.

19. A sense amplifier comprising:

a memory bit line sense node and a reference bit line sense node;

two cross coupled differential transistors having the gate of a first one coupled to the memory bit line sense node and the drain of a second one coupled to the memory bit line sense node and having the gate of the second coupled to the reference bit line sense node and the drain of the first coupled to the reference bit line sense node;

two identical load transistors, coupled between a selected voltage potential and the memory bit line sense node and the reference bit line sense node, respectively, and their respective gates cross-coupled to the respective reference bit line sense node and the memory bit line sense node, respectively, a first clocked transistor connecting the gates of the two identical loads to each other when the clocked transistor is clocked to be conductive and disconnecting the gates of the identical load transistors from each other when the first clocked transistor is clocked to be non-conductive; and a second clocked transistor connecting a memory bit line to a reference bit line when the second clocked transistor is clocked to be conductive and disconnecting the memory bit line when the second clocked transistor is clocked to be non-conductive a third clocked transistor connecting the sources of the cross-coupled differential transistors to a reference potential when the third clocked transistor is clocked to be conductive, the first clocked transistor, second clocked transistor, and the third clocked transistor each being clocked by respective first, second, and third clocking signals.

20. The sense amplifier of claim 19, further including:

a pair of pass transistors, one each coupled between the memory bit line and the memory bit line sense node and the reference bit line and reference bit line sense node; and a pair of NOR gates each having one of their inputs clocked by the third clocking signal and the other input connected to the memory bit line and the reference bit line, respectively, and each having their outputs connected to the gate of the respective one of the pair of the pass transistors, respectively.

21. The sense amplifier according to claim 20, further including:

a pair of precharge switching transistors connected from a selected voltage potential to the memory bit line and reference bit line, respectively, and each having their gate coupled to the output of the respective NOR gates so that their state of being conductive or nonconductive is controlled by the output of said respective NOR gates.

22. The sense amplifier according to claim 21, further including:

a second pair of precharge switching transistors coupled to the memory bit line and reference bit, respectively, and having their gates coupled to the outputs of the respective NOR gates.

23. The sense amplifier according to claim 22, further including:

a pair of precharge load transistors coupled between a selected voltage potential and said respective second pair of precharge switching transistors, respectively, and said pair having their gates coupled to the gates of the two identical load transistors, the pair of precharge load transistors being identical to each other in size and dimensions.

24. The sense amplifier according to claim 19, further including:

a switching transistor connected between a selected voltage potential and the precharge transistor coupled to the memory bit line, the gate of said switching transistor being coupled to a clock signal so that the state of the switching transistor is controlled by the state of the clock signal.

25. A sense amplifier comprising:

a memory bit line and a reference bit line having a memory bit line sense node and a reference bit line sense node respectively;

two cross coupled differential transistors having the gate of a first one coupled to the memory bit line sense node and the drain of a second one coupled to the memory bit line sense node and having the gate of the second coupled to the reference bit line sense node and the drain of the first coupled to the reference bit line sense node;

two identical load transistors, coupled between a selected voltage potential and the memory bit line sense node and the reference bit line sense node, respectively, and their respective gates cross-coupled to the respective reference bit line sense node and the memory bit line sense node, respectively;

a clocked transistor connecting the gates of the two identical loads to each other when the clocked transistor is clocked to be conductive and disconnecting the gates of the identical load transistors from each other when it is clocked to be nonconductive;

a pair of pass transistors, one each coupled between the memory bit line and the memory bit line sense node and the reference bit line and reference bit line sense node; and a pair of NOR gates each having one of their inputs clocked and the other input connected to the memory bit line and the reference bit line, respectively, and each having their outputs connected to the gate of the respective one of the pair of the pass transistors, respectively.

26. The sense amplifier according to claim 25 further including:

a pair of precharge switching transistors connected from a selected voltage potential to the memory bit line and reference bit line, respectively, and each having their gate coupled to the output of the respective NOR gates so that their state of being conductive or nonconductive is controlled by the output of said respective NOR gates.

* * * * *